(12) United States Patent
Wu et al.

(10) Patent No.: US 10,398,041 B2
(45) Date of Patent: Aug. 27, 2019

(54) MAKING A HYDROPHOBIC SURFACE FOR AN OBJECT

(71) Applicants: HEWLETT-PACKARD DEVELOPMENT COMPANY, L.P., Houston, TX (US); Kuan-Ting Wu, Taipei (TW); Kevin Voss, Houston, TX (US); Ya-Ting Yeh, Taipei (TW)

(72) Inventors: Kuan-Ting Wu, Taipei (TW); Kevin Voss, Houston, TX (US); Ya-Ting Yeh, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 15/746,129

(22) PCT Filed: Aug. 17, 2015

(86) PCT No.: PCT/CN2015/087229
§ 371 (c)(1),
(2) Date: Jan. 19, 2018

(87) PCT Pub. No.: WO2017/028157
PCT Pub. Date: Feb. 23, 2017

(65) Prior Publication Data
US 2018/0213659 A1    Jul. 26, 2018

(51) Int. Cl.
*C03C 17/42*    (2006.01)
*H05K 5/02*    (2006.01)
(Continued)

(52) U.S. Cl.
CPC .............. *H05K 5/02* (2013.01); *C03C 17/42* (2013.01); *B05D 3/06* (2013.01); *B05D 3/10* (2013.01);
(Continued)

(58) Field of Classification Search
CPC ..................................................... C03C 17/42
See application file for complete search history.

(56) References Cited

U.S. PATENT DOCUMENTS

| | | |
|---|---|---|
| 5,435,887 A | 7/1995 | Rothschild et al. |
| 6,440,541 B1 | 8/2002 | Humphrey et al. |

(Continued)

FOREIGN PATENT DOCUMENTS

| | | |
|---|---|---|
| CN | 1990899 A | 7/2007 |
| JP | H03240258 A | 10/1991 |
| JP | 2007238352 A | 9/2007 |

OTHER PUBLICATIONS

Bharat Bhushan et al., "Micro-, nano- and hierarchial structures for superhydrophobicity, self-cleaning and low adhesion," Mar. 30, 2009, pp. 1631-1672, Phil. Trans R Soc. A (2009) 367, Royal Society Publishing.

*Primary Examiner* — Hung V Ngo
(74) *Attorney, Agent, or Firm* — HPI Patent Department

(57) ABSTRACT

Various examples provide a method of making a hydrophobic surface for an object. According to the method, a hydrophobic coating may be applied to an original surface of the object. A microstructure may be formed on the original surface of the object. The hydrophobic surface of the object may be obtained with the microstructure submerged by the hydrophobic coating. The microstructure may be a rough structure including micro-sired portions, and may have greater hardness than the hydrophobic coating.

5 Claims, 7 Drawing Sheets

(51) Int. Cl.
*B05D 3/06* (2006.01)
*B05D 3/10* (2006.01)
*B05D 3/12* (2006.01)

(52) U.S. Cl.
CPC ............ *B05D 3/12* (2013.01); *C03C 2217/76* (2013.01); *C03C 2218/31* (2013.01); *C03C 2218/32* (2013.01)

(56) References Cited

U.S. PATENT DOCUMENTS

| | | |
|---|---|---|
| 2005/0266250 A1 | 12/2005 | Hayakawa |
| 2010/0004373 A1 | 1/2010 | Zhu et al. |
| 2012/0094405 A1 | 4/2012 | Chiang et al. |
| 2012/0107556 A1 | 5/2012 | Zhang et al. |
| 2014/0295145 A1 | 10/2014 | Mizuno et al. |
| 2015/0172426 A1* | 6/2015 | Asrani ............... H04B 1/40 455/77 |

* cited by examiner

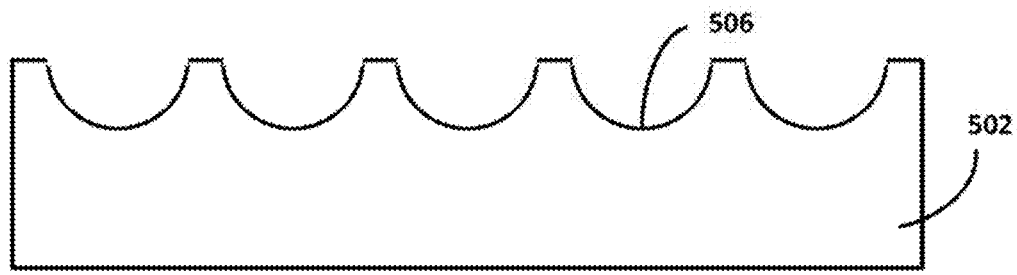
FIG. 4
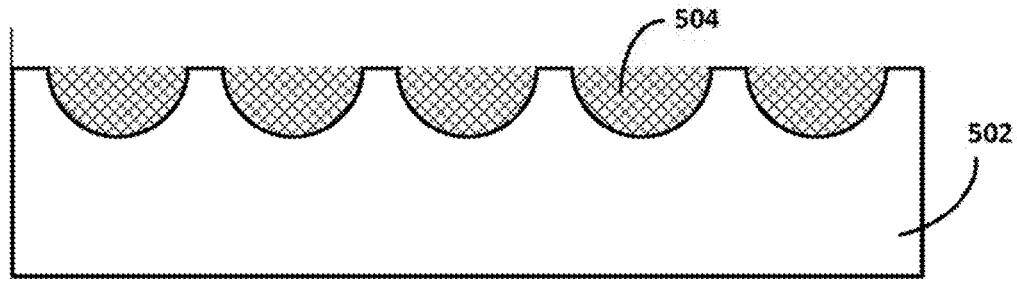
FIG. 5a
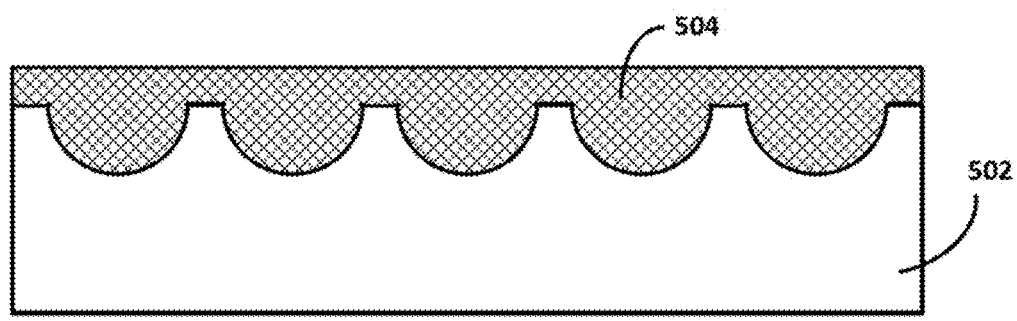
FIG. 5b
FIG. 5c

60
| form a microstructure on an original surface of an object, the microstructure includes micro-sized raised portions spreading over the surface | — 61 |
↓
| feed a material of a hydrophobic coating in between the micro-sized raised portions to form a smooth surface for the object | — 62 |
FIG. 6
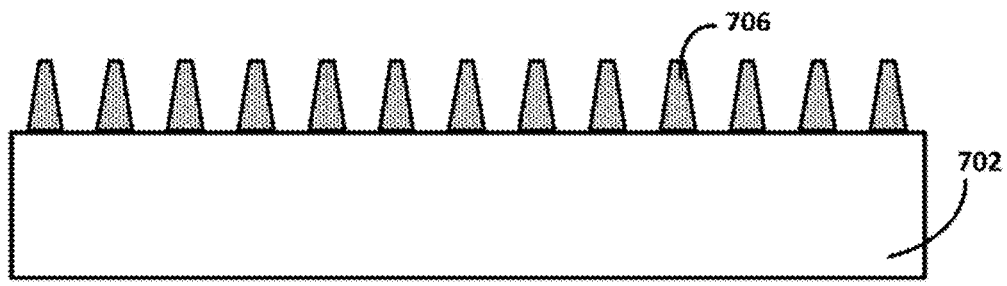
FIG. 7a
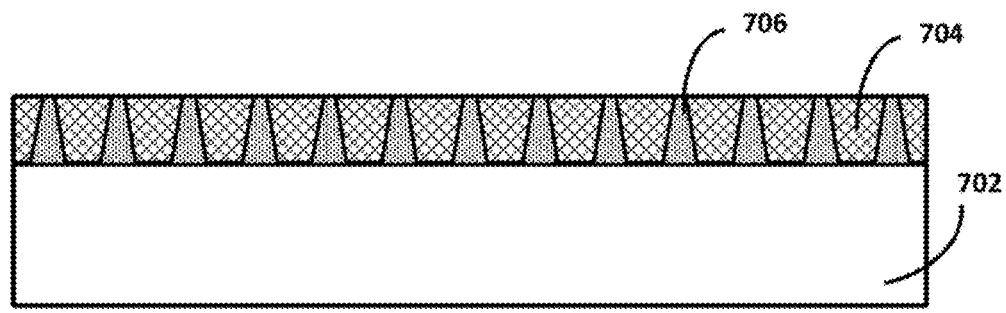
FIG. 7b
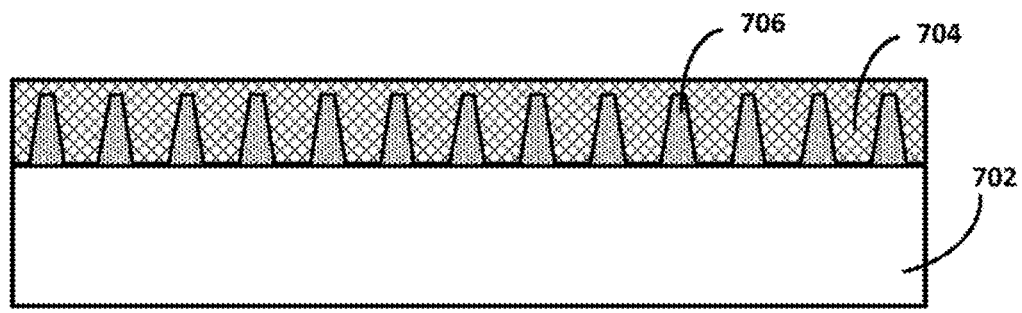
FIG. 7c

MAKING A HYDROPHOBIC SURFACE FOR AN OBJECT

BACKGROUND

Hydrophobicity is a physical capability of repelling water, or in other words, not attracting water. Hydrophobic molecules, such as alkanes, oils, fats, and greasy substances, or hydrophobic composites may be used as a material for providing a hydrophobic surface for an object.

BRIEF DESCRIPTION OF THE DRAWINGS

For a better understanding of the present disclosure, references could be made to the Detailed Description below, in conjunction with the following drawings in which like reference numerals refer to corresponding parts throughout the figures.

FIG. 4 is a flowchart illustrating a method of making a hydrophobic surface for an object in accordance with examples of the present disclosure;

FIG. 5a is a schematic diagram illustrating micro-sized concave portions in a surface of an object in accordance with examples of the present disclosure;

FIGS. 5b and 5c are schematic diagrams illustrating micro-sized concave portions filled with material of a hydrophobic coating in accordance with examples of the present disclosure;

FIG. 6 is a flowchart illustrating a method of making a hydrophobic surface for an object in accordance with examples of the present disclosure;

FIG. 7a is a schematic diagram illustrating micro-sized raised portions on a surface of an object in accordance with examples of the present disclosure;

FIGS. 7b and 7c are schematic diagrams illustrating micro-sized raised portions having a material of a hydrophobic coating fed in between in accordance with examples of the present disclosure;

DETAILED DESCRIPTION

Reference will now be made in detail to examples, which are illustrated in the accompanying drawings. In the following detailed description, numerous specific details are set forth in order to provide a thorough understanding of the present disclosure. Also, the figures are illustrations of examples, in which modules or procedures shown in the figures are not necessarily essential for implementing the present disclosure. In other instances, well-known methods, procedures, components, and circuits have not been described in detail so as not to unnecessarily obscure aspects of the examples.

The hydrophobic surface may have the ability of repelling water and oil, anti-smudging, anti-finger print, and the like. In an example, hydrophobic as used herein may refer to ordinary hydrophobic, super hydrophobic, high hydrophobic, or ultra hydrophobic, etc. Super hydrophobicity (or high hydrophobicity, ultra hydrophobicity), also referred to as the Lotus effect, can be achieved by biomimetic surfaces, such as one that imitates the typical micro/nanostructure of a lotus leaf.

Figure 1:
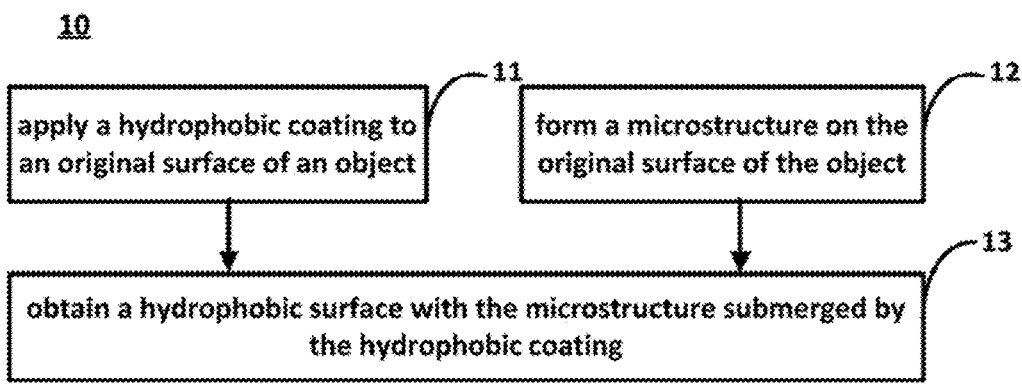
FIG. 1 is a flowchart illustrating a method of making a hydrophobic surface for an object in accordance with examples of the present disclosure.

Various examples of the present disclosure provide a method of making a hydrophobic surface for an object. FIG. 1 illustrates a method 10 of making a hydrophobic surface for art object in accordance with various examples of the present disclosure, to provide a durable and wear resistant coating for the object.

Referring to FIG. 1, the method 10 may include the following procedures.

At block 11, a hydrophobic coating may be applied to an original surface of an object.

The hydrophobic coating refers to a coating that has hydrophobic capabilities. The hydrophobic coating may be made up of materials selected from a group of: hydrophobic elastomers, hydrophobic polymers, polyurethane, fluorochemical materials, hexafluoropropylene oxide (HFPO), or organosilances such as, alkylsilane, alkoxysilane, acrylsilances, polyhedral oligomeric silsequioxane (POSS) and fluorine-containing organosilanes, just to name a few. Fabrication methods of the hydrophobic coating may include particle deposition, sol-gel techniques, plasma treatments, vapor deposition, casting techniques, painting techniques, and the like.

The hydrophobic coating may be applied to the original surface of any object to make it waterproof. The surface may be the outer surface of an object, and the object may be an electronic device, an instrument, a household appliance, a hand tool, or the like. The surface may also be the inner surface of an object, and the object may be a container, a shovel, or the like. The original surface as used herein refers to a surface of an object before a waterproofing process disclosed in various examples is performed.

At block 12, a microstructure may be formed on the original surface of the object, to make the microstructure submerged by the hydrophobic coating.

The microstructure may be a rough structure having micro-sized portions. The rough structure may refer to a structure having an irregular shape. For example, the micro sized portions may be connected to each other to present a rough surface. The micro-sized portions may also be separated from each other as discrete portions. The micro-sized portions may include a set of micrometer-scale three dimensional portions, e.g., micro-sized raised portions or micro sized concave portions. After the microstructure is formed on the original surface of the object, the micro-sized portions may be distributed evenly or unevenly over the surface of the object. In an example, the micro-sized raised portions or micro-sized concave portions may be 5 to 150 micrometers in height or in depth, and may have spacing of 5-100 micrometers between one another. In an example, the micro sized raised portions may be 6 to 60 micrometers in width or in diameter. In an example, the micro-sized concave portions may be 10 to 200 micrometers in width or in diameter.

The microstructure may have greater hardness than the hydrophobic coating. In an example, the microstructure may be made up of materials that may include: metal, plastics, ceramics, carbon fiber, glass, wood, a hybrid composite, or the like. The hybrid composite may include metal and carbon fiber composite, carbon fiber and glass fiber composite, metal and plastic composite, carbon fiber and plastic composite, or the like. The microstructure may be formed using a method selected according to factors such as the material of the microstructure, the fabrication order of the microstructure and the hydrophobic coating, the material of the original surface of the object, and etc. In an example, fabrication methods of the microstructure may include: casting, molding, injection molding, mold pressing, embossing rolling, three dimensional (3D) printing, screening printing, injection printing, laser engraving, chemical etching, curing, semi-curing, and the like.

At block 13, a hydrophobic surface of the object with the microstructure submerged by the hydrophobic coating may be obtained.

After the hydrophobic surface is partially removed, e.g., by wear or abrasion, to reveal the top of the microstructure, the surface of the object may include microstructure surface portions and hydrophobic surface portions interwoven with each other. Since the material of the microstructure has greater hardness than the material of the hydrophobic coating, the microstructure surface portions can protect the hydrophobic surface portions from being worn out, and the hydrophobic surface portions can still make the surface of the object hydrophobic. As such, the hydrophobic surface of the object can be durable and wear resistant.

Figure 2:
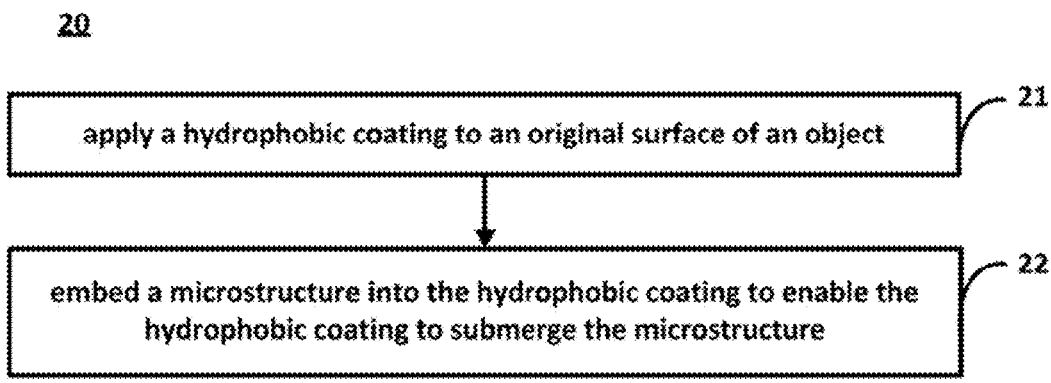
FIG. 2 is a flowchart illustrating a process of forming a microstructure after a hydrophobic coating is applied to an object in accordance with examples of the present disclosure.

According to various examples, the microstructure may be formed before or after the hydrophobic coating is applied to the original surface of the object. FIG. 2 illustrates a process 20 of forming a microstructure after a hydrophobic coating is formed. Referring to FIG. 2, the process 20 may include the following procedures.

At block 21, a hydrophobic coating may be applied to an original surface of an object.

Figure 3A:
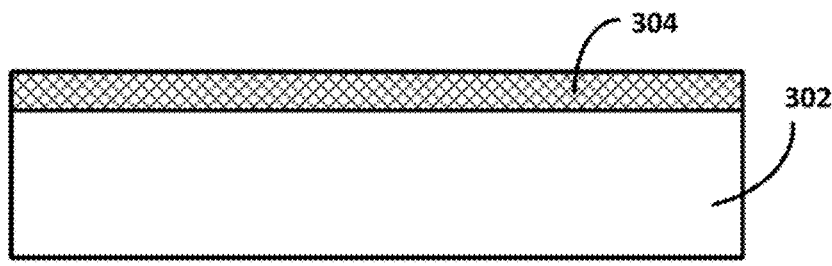
FIG. 3a is a schematic diagram illustrating a hydrophobic coating on a surface of an object in accordance with examples of the present disclosure.

As shown in FIG. 3a, a hydrophobic coating 304 may be formed on an original surface of the object 302. In various examples illustrated herein, the object shown in the drawings may be a portion of an object, e.g., a portion of an outer surface of a component of an object that is to be coated with the hydrophobic coating. The object may be in any shape, and the surface may not be flat. For example, the surface may be curved, or the like. The drawings are only for illustrative purposes, not accurate depictions.

At block 22, a microstructure may be embedded into the hydrophobic coating to enable the hydrophobic coating to submerge the microstructure. As such, a hydrophobic coating of the object may be formed.

Figure 3B:
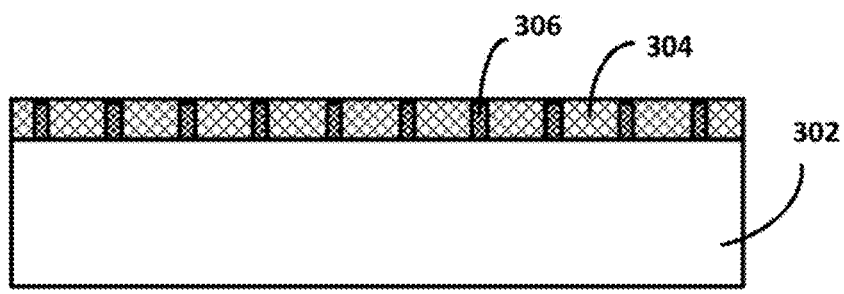
FIG. 3b is a schematic diagram illustrating a microstructure embedded into the hydrophobic coating of FIG. 3a in accordance with examples of the present disclosure.
Figure 8A:
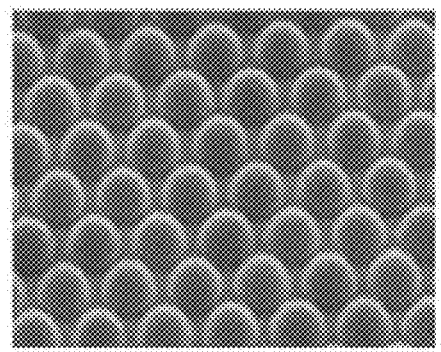
FIG. 8a, 8b, 8c, 8d are schematic diagrams illustrating a microstructure in accordance with examples of the present disclosure.
Figure 8B:
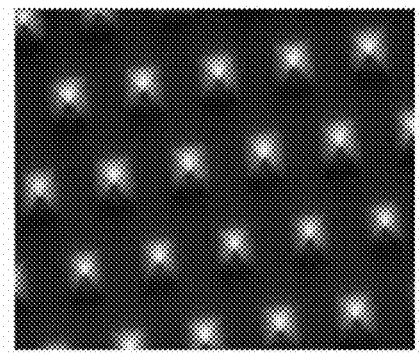
Figure 8C:
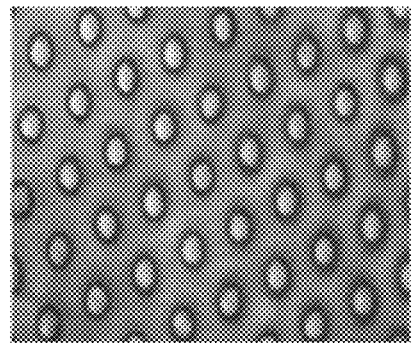
Figure 8D:
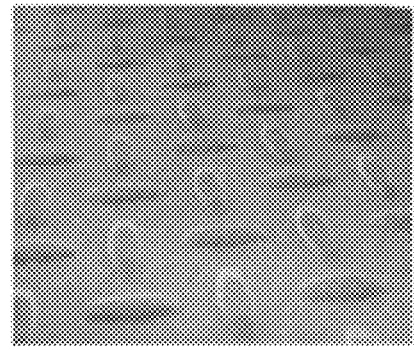

As shown in FIG. 3b, a microstructure may include micro-sized raised portions 306. The micro-sized raised portions 306 may be embedded into the hydrophobic coating 304 to generate a hydrophobic surface of the object 302. The micro-sized raised portions 306 may be in the form of micro-sized pillars, cones, or the like. The micro-sized raised portions 306 may be embedded into the hydrophobic coating 304 by injection, pressing, curing, or the like.

In an example, the microstructure may be formed before the hydrophobic coating is applied to the original surface of the object. Referring to FIG. 4, a method 40 of fabricating a hydrophobic surface of an object may include the following procedures.

At block 41, a microstructure may be formed on an original surface of an object, and may include micro-sized concave portions spreading over the surface of the object.

As shown in FIG. 5a, micro-sized concave portions 506 may be formed in the original surface of the object, e.g., by casting, mold pressing, embossing rolling, laser engraving, chemical etching, or the like. The opening of the micro-sized concave portions 506 may be irregularly shaped, or in shapes such as circle, triangle, square, oval, trapezoid, rectangular, or the like.

At block 42, the micro-sized concave portions may be filled with the material of a hydrophobic coating to form a smooth surface for the object. The smooth surface may be the hydrophobic surface of the object.

As shown in FIG. 5b, a material of a hydrophobic coating may be put into the micro-sized concave portions to submerge the micro-sized concave portions 506. In an example, the micro-sized concave portions 506 may be filled to the rim, to form a smooth surface, as shown in FIG. 5b. In an example, the material of the hydrophobic coating may be supplied until the rims of the micro-sized concave portions are submerged. In this case, the rims of the micro-sized concave portions may be beneath the surface of the hydrophobic coating as shown in FIG. 5c. As such, a hydrophobic coating 504 may be formed on the original surface of the object 502 to generate a hydrophobic surface for the object.

FIG. 6 illustrates a method 60 of forming a microstructure after a hydrophobic coating is applied to a surface of an object. The method 60 may include the following procedures.

At block 61, a microstructure may be formed on an original surface of an object, and may include micro-sized raised portions spreading over the original surface of the object.

Referring to FIG. 7a, a microstructure may be formed on an original surface of an object 702, and may include micro-sized raised portions 706. The micro-sized raised portions 706 may be selected from a group of micro-sized convex portions, micro-sized pyramids, micro-sized raised cones, micro-sized raised points, micro-sized raised stripes, micro-sized raised ripples, micro-sized raised grids, and the like. The micro-sized raised points may be in a shape selective from a group of: circle, triangle, square, oval, trapezoid, rectangular, just to name a few. FIGS. 8a, 8b, 8c and 8d illustrates several examples of the micro-sized raised portions.

At block 62, the material of a hydrophobic coating may be fed in between the micro-sized raised portions to form a smooth surface for the object.

Referring to FIGS. 7b and 7c, a hydrophobic coating 704 may be applied to the surface of the object 702 in a manner that the material of the hydrophobic coating 704 are fed in between the micro-sized raised portions 706 and submerge the micro-sized raised portions 706 to make the coated surface of the object level. In an example, the material of the hydrophobic coating may be fed in between the micro-sized raised portions 706 to reach the top of the micro-sized raised portions 706 to make the coated surface level, as shown in FIG. 7b. In an example, the material of the hydrophobic coating may be fed in between the micro-sized raised portions 706 until the top of the micro-sized raised portions 706 is submerged by the material. In this case, the top of the micro-sized raised portions 706 may be beneath the surface of the hydrophobic coating 704 as shown in FIG. 7c. As such, a hydrophobic coating 704 is formed on the surface of the object 702.

Figure 9:
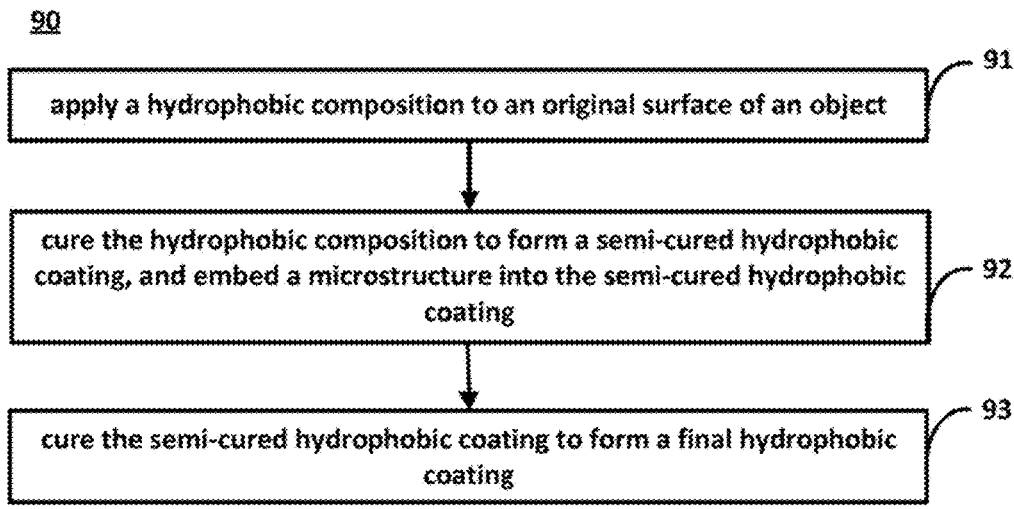
FIG. 9 is a flowchart illustrating a process of embedding a microstructure into a hydrophobic coating before the hydrophobic coating is cured in accordance with examples of the present disclosure.

In an example, the microstructure may be formed during the formation process of the hydrophobic coating. As shown in FIG. 9, a method 90 of fabricating a hydrophobic surface of an object may include the following procedures.

At block 91, a hydrophobic composition may be applied to an art original surface of an object.

Figure 10A:
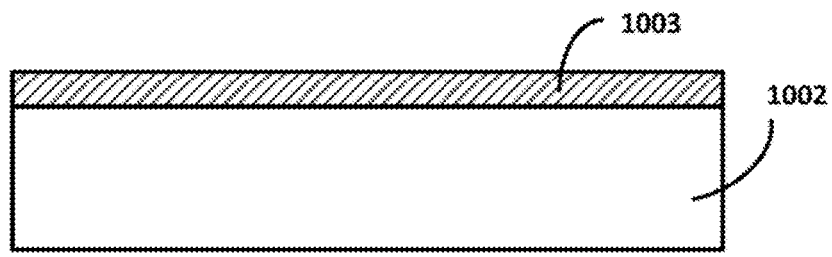
FIG. 10a is a schematic diagram illustrating a semi-cured hydrophobic coating on a surface of an object in accordance with examples of the present disclosure.

Referring to FIG. 10a, an object 1002 may have a layer of a hydrophobic composition on top of its surface. The hydrophobic composition may be in the form of liquid, or jelly, or powder, and can be cured to form a solid hydrophobic coating. The curing may refer to toughening or hardening of a material by, e.g., by heat, electron beams, chemical additives or ultraviolet radiation.

At block 92, the hydrophobic composition may be cured to form a semi-cured hydrophobic coating, and a microstructure may be embedded into the semi-cured hydrophobic coating.

At block 93, the semi-cured hydrophobic coating may be cured to form a final hydrophobic coating.

Figure 10B:
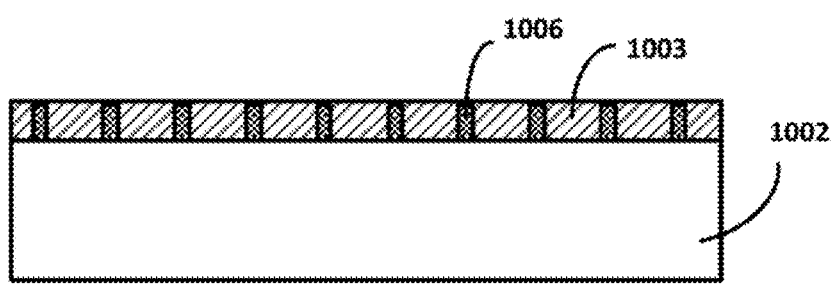
FIG. 10b is a schematic diagram illustrating a microstructure embedded into the semi-cured hydrophobic coating of FIG. 8a in accordance with examples of the present disclosure.

As shown in FIG. 10b, the hydrophobic composition may be semi-cured to form a semi-cured hydrophobic coating 1003. When the hydrophobic composition is semi-cured, micro-sized raised portions 1006 may be embedded into the semi-cured hydrophobic coating 1003. Then the curing process may be continued to turn the semi-cured hydrophobic coating 1003 into the final hydrophobic coating 1004 with the micro-sized raised portions 1006 embedded in it. As such, a hydrophobic surface of the object 1002 can be obtained.

According to various examples, the object may include a substrate, and the microstructure may be formed on the substrate or on a second coating between the substrate and the hydrophobic coating.

Figure 10C:
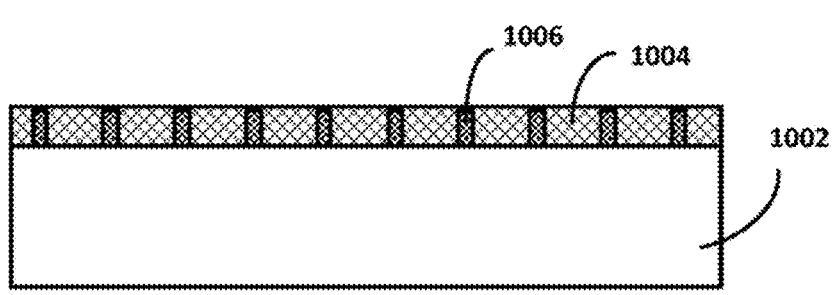
FIG. 10c is a schematic diagram illustrating a cured hydrophobic coating in which a microstructure is embedded in accordance with examples of the present disclosure.

In an example, the object shown in the drawings, e.g., the object 302 of FIG. 3b, the object 502 of FIGS. 5b and 5c, the object 702 of FIGS. 7b and 7c, the object 1002 of FIG. 10c, may be a portion of the object, and the portion may be part of a substrate of the object, e.g., a substrate of a housing of the object. For example, as shown in FIG. 10c, an object may include a substrate 1002, a hydrophobic coating 1004 on the substrate 1002, and a microstructure 1006. The microstructure 1006 may be embedded in the hydrophobic coating 1004, and have greater hardness than the hydrophobic coating. The microstructure may have a rough structure which may include micro-sized portions.

In an example, the microstructure may be formed on the substrate to adhere to the substrate. For example, the micro-sized concave portions 506 of FIG. 5a may be formed in the substrate of the object 502 and adhere to the substrate. The micro-sized raised portions 706 of FIG. 7b may be formed on the substrate of the object 702 to adhere to the substrate. When the microstructure is formed on the substrate, a proper formation method may be selected according to the material of the microstructure, the material of the substrate, etc. The substrate may be made of a material selected from a group of: metal, plastics, ceramics, carbon fiber, glass, wood, a hybrid composite, or the like. In an example, the microstructure may be made of a material selected from a group of: metal, plastics, ceramics, carbon fiber, glass, wood, hybrid composites, or the like. In an example, the microstructure may be made of the same material with the substrate.

In an example, the microstructure may be fabricated during production of the substrate. For example, the substrate may be produced to include the microstructure, for example, by die casting, molding, injection molding, curing, semi-curing or the like, during the production of the substrate.

In an example, the microstructure may be formed on a prepared substrate. For example, the microstructure may be formed on a prepared substrate by mold pressing, embossing rolling, 3D printing, screening printing, injection printing, laser engraving, chemical etching, curing, semi-curing, or the like.

According to various examples, the object may include one or plural coatings between the substrate of the object and the hydrophobic coating. In this case, the microstructure may be formed on, or together with, one of the coatings. The coatings may be selected from a group of: a powder coating, a primer coat, a basecoat, a topcoat, a sol-gel coating, and the like.

The powder coating refers to a type of coating that is applied as a free-flowing, dry powder. The powder coating may typically be applied electrostatically and then cured under heat to allow it to flow and form a coating. The powder may be a thermoplastic or a thermoset polymer. It is usually used to create a hard finish that is tougher than paint.

The primer coat, or undercoat, refers to a preparatory coating put on materials before painting. Priming may enable better adhesion of paint to the surface, increase paint durability, and provide additional protection for the material being painted.

The basecoat may contain visual properties of color and effects. The base coat may be applied after the primer coat.

The topcoat may be a transparent or translucent coat of paint or other finish applied over the underlying material as a sealer.

The sol-gel coating refers to a coating generated by a sol-gel process. The sol-gel process refers to a process of producing solid materials from small molecules. The method is used for the fabrication of metal oxides, especially the oxides of silicon and titanium. The process may involve conversion of monomers into a colloidal solution (sol) that acts as the precursor for an integrated network (or gel) of either discrete particles or network polymers. In some cases, the topcoat may be a sol-gel coat.

When the microstructure is formed on one of the coatings, a proper formation method may be selected according to the material of the microstructure, the material of the coating, etc. The microstructure may be made of the same material with the coating, or a different material.

FIGS. 11a, 11b, 11c and 11d are some of the examples of the microstructure formed on a substrate or on a coating of the substrate.

Figure 11A:
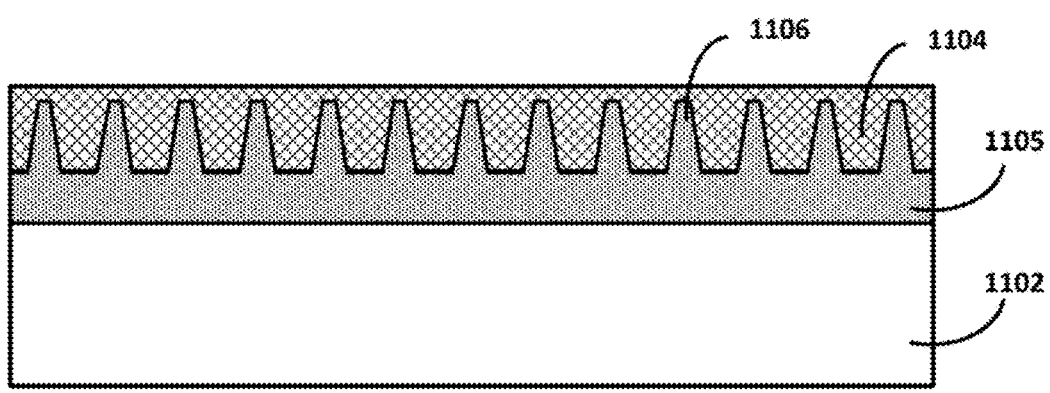
FIGS. 11a, 11b, 11c and 11d are schematic diagrams illustrating a hydrophobic surface of an object in accordance with examples of the present disclosure.

Referring to FIG. 11a, there may be a second coating 1105 between a substrate 1102 of an object and a hydrophobic coating 1104. A microstructure may be formed on the second coating 1105. In an example, the microstructure may include micro-sized raised portions 1106 formed on the second coating 1105. In an example, the microstructure may include micro-sized concave portions between the portions 1106, and may be formed in the second coating 1105 by, for example, molding, mold pressing, embossing rolling, laser engraving, chemical etching, or the like.

Figure 11B:
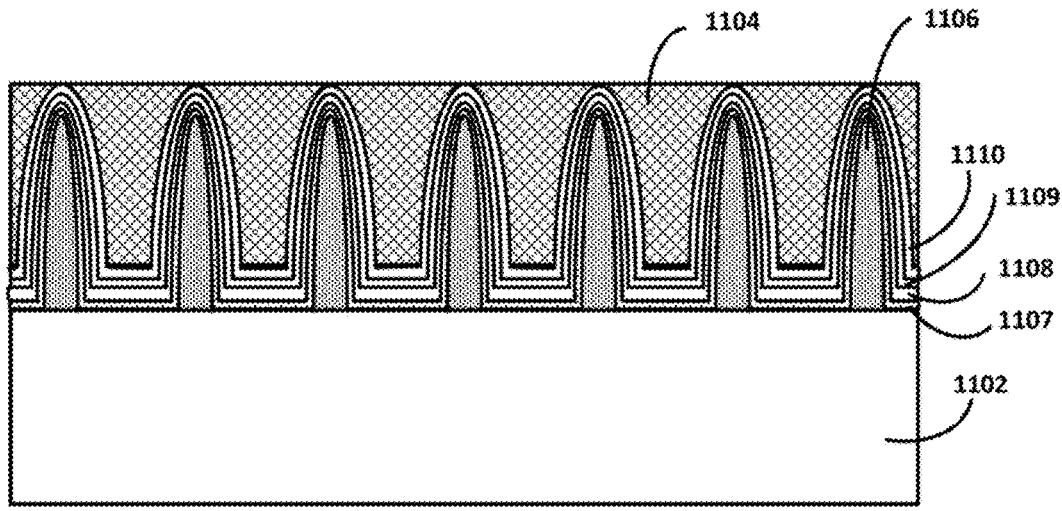

Referring to FIG. 11*b*, a substrate 1102 of an object may have plural coatings. A microstructure may be formed on the substrate 1102, and also coated with the plural coatings. For example, the coatings may include a powder coating 1107, a primer coat 1108, a basecoat 1109 and a topcoat 1110. The microstructure may be micro-sized raised portions 1106 or micro-sized concave portions between the raised portions 1106. The height of the micro-sized raised portions 1106 or the depth of the micro-sized concave portions may be formed to be greater than the overall thickness of the plural coatings, such that the surface of the substrate with the coatings still comprise micro-sized raised portions or micro-sized concave portions. In an example, the formation process of the coatings may be controlled such that the formed coatings are thin enough not to submerge the micro-sized raised portions or the micro-sized concave portions. The hydrophobic coating 1104 may be applied to the surface of the substrate coated with the plural coatings, i.e., the surface of the topcoat 1110.

Figure 11C:
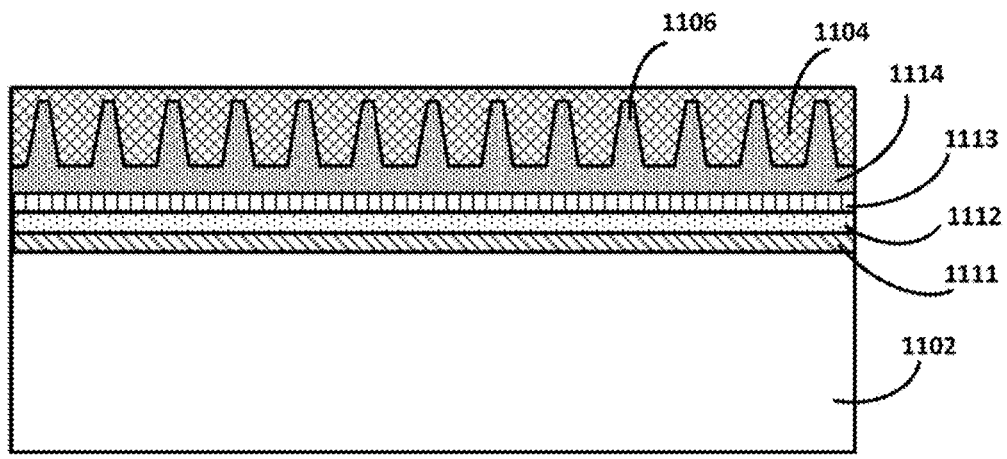

Referring to FIG. 11*c*, a substrate 1102 of an object may be coated with plural coatings, for example, a powder coating 1111, a primer coat 1112, a basecoat 113 and a sol-gel and polymer hybrid coating 1114. The microstructure may be formed on the outmost coating, i.e., the sol-gel and polymer hybrid coating 1114. A hydrophobic coating 1104 may be applied to the surface of the substrate coated with the coatings, i.e., on top of the sol-gel and polymer hybrid coating 1114.

Figure 11D:
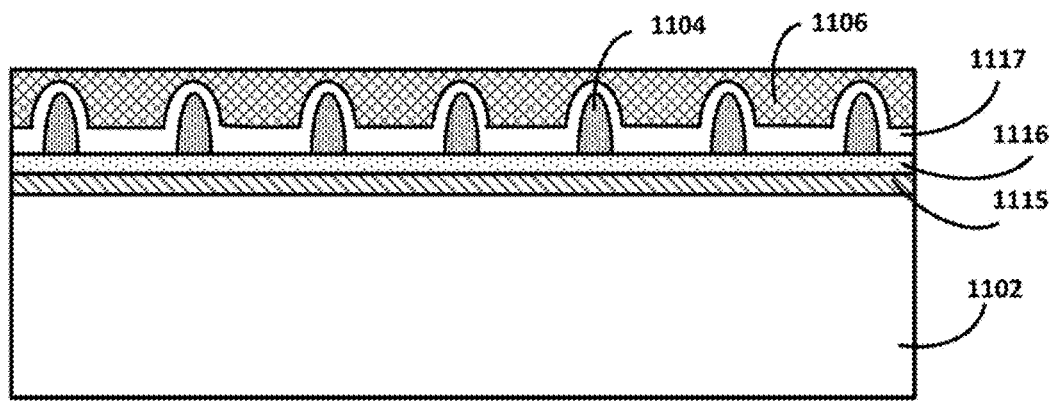

Referring to FIG. 11*d*, a substrate 1102 of an object may be coated with a primer coat 1115, a basecoat 1116 and a topcoat 1117. A microstructure may be formed on the base coat 1116. The topcoat 1117 is applied on top of the basecoat 1116 with the microstructure. The microstructure may include micro-sized raised portions 1104 which results in the micro-sized raised portions on the outer surface of the topcoat 1117. Then a hydrophobic coating 1106 may be applied to the surface of the topcoat 1117 to submerge the micro-sized raised portions.

In the above examples, the microstructure may include micro-sized concave portions or micro-sized raised portions. The hydrophobic surface of the object may be formed by filling the micro-sized concave portions with the material of the hydrophobic coating, or by feeding the material of the hydrophobic coating in between the micro-sized raised portions to submerge the micro-sized raised portions or the micro-sized concave portions. As such, after a portion of the hydrophobic coating is removed, e.g., by wear or abrasion, to reveal the top of the microstructure, e.g., revealing the top of the micro-sized raised portions 706 as shown in FIG. 7*b* or revealing the rim of the micro-sized concave portions as shown in FIG. 5*a*, the top of the microstructure can protect the hydrophobic material filled in the micro-sized concave portions or between the micro-sized raised portions from being worn out because the microstructure has greater hardness than the hydrophobic coating. Thus, the hydrophobic material protected by the microstructure can enable the surface of the object to repel water and oil. That is, the hydrophobic coating of the object can be durable and wear resistant.

Figure 12:
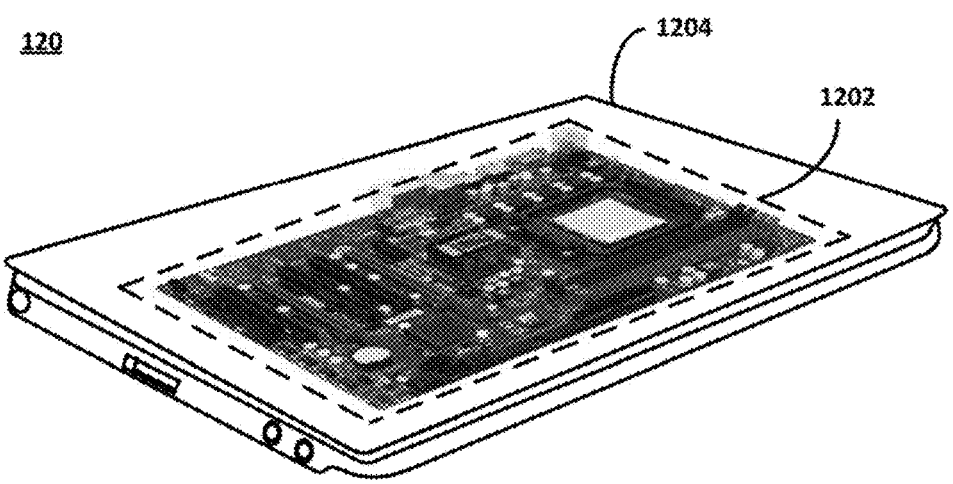
FIG. 12 is a schematic diagram illustrating an electronic device having a hydrophobic surface in accordance with examples of the present disclosure.

According to various examples, the technical mechanism may be applied to any object, e.g., an electronic device, an instrument, a household appliance, a hand tool, or the like. FIG. 12 illustrates an electronic, device 120. The electronic device 120 may include electrical circuits 1202 and a housing 1204. The housing 1204 may include a substrate, a microstructure formed on an outer surface of the substrate, and a hydrophobic coating. The microstructure may include micro-sized raised portions with a rough structure spreading aver the outer surface of the substrate. A hydrophobic coating may be applied to the outer surface of the substrate to submerge the microstructure, and may have smaller hardness than the microstructure.

In an example, the material of the hydrophobic coating may be fed in between the micro-sized raised portions to make the outer surface of the hydrophobic coating level. As such, the microstructure can protect the hydrophobic material filled, between the micro-sized raised portions from being worn out, and the hydrophobic coating of the object can be durable and wear resistant.

The electronic device may include personal computers, telephones, MP3 players, audio equipment, televisions, calculators, GPS automotive electronics, digital cameras, USB flash drive, and the like.

The foregoing description, for purpose of explanation, has been described with reference to specific examples. However, the illustrative discussions above are not intended to be exhaustive or to limit the present disclosure to the precise forms disclosed. Many modifications and variations are possible in view of the above teachings. The examples were chosen and described in order to best explain the present disclosure and its practical applications, to thereby enable others skilled in the art to best utilize the present disclosure and various examples with various modifications as are suited to the particular use contemplated. All of the features disclosed in this specification (including any accompanying claims, abstract and drawings), and/or all of the elements of any method or process so disclosed, may be combined in any combination, except combinations where at least some of such features and/or elements are mutually exclusive.

What is claimed is:

1. A method of making a hydrophobic surface for an object, comprising:

applying a hydrophobic coating to an original surface of the object;

forming a microstructure on the original surface of the object; and obtaining the hydrophobic surface with the microstructure submerged by the hydrophobic coating, wherein forming the microstructures on the original surface of the object comprises: embedding the microstructure into the hydrophobic coating after the hydrophobic coating is applied to the original surface, to enable the hydrophobic coating to submerge the microstructure;

wherein the microstructure is a rough structure including micro-sized portions, and the microstructure has greater hardness than the hydrophobic coating.

2. The method according to claim 1, wherein applying the hydrophobic coating to the original surface of the object comprises:

feeding a material of the hydrophobic coating in between the micro-sized portions to form a smooth surface for the object after the microstructure is formed on the original surface.

3. The method according to claim 1, wherein applying the hydrophobic coating to the original surface of the object comprises:

applying a hydrophobic composition to the original surface;

curing the hydrophobic composition to form a semi-cured hydrophobic coating;

embedding the microstructure into the semi-cured hydrophobic coating; and curing the semi-cured hydrophobic coating to generate the hydrophobic coating.

4. The method according to claim 1, wherein forming the microstructure on the original surface of the object comprises:

forming the microstructure on a substrate or on a second coating between the substrate and the hydrophobic coating.

5. The method according to claim 1, wherein forming the microstructure on the original surface comprises:

forming the microstructure on the original surface using a process selected from a group comprising: casting, injection molding, mold pressing, embossing rolling, three dimensional printing, screening printing, injection printing, laser engraving, chemical etching, curing, and semi-curing.

\* \* \* \* \*

UNITED STATES PATENT AND TRADEMARK OFFICE
CERTIFICATE OF CORRECTION

PATENT NO. : 10,398,041 B2  
APPLICATION NO. : 15/746129  
DATED : August 27, 2019  
INVENTOR(S) : Kuan-Ting Wu et al.

Page 1 of 1

It is certified that error appears in the above-identified patent and that said Letters Patent is hereby corrected as shown below:

On the Title Page

In Column 2, item (57), Abstract, Line 8, delete "micro-sired" and insert -- micro-sized --, therefor.

Signed and Sealed this
Twelfth Day of November, 2019

Andrei Iancu
*Director of the United States Patent and Trademark Office*